United States Patent
Yagi et al.

(10) Patent No.: US 12,258,982 B2
(45) Date of Patent: Mar. 25, 2025

(54) RESIN MOLDED ARTICLE, RESIN MOLDED ARTICLE MANUFACTURING METHOD, AND HYDRAULIC CONTROL DEVICE

(71) Applicants:Yazaki Corporation, Tokyo (JP); ADVICS CO., LTD., Kariya (JP)

(72) Inventors: Arata Yagi, Makinohara (JP); Isanori Shimizu, Makinohara (JP); Masataka Nagayama, Makinohara (JP); Shinji Ohtsuka, Makinohara (JP); Yoshihiro Takekawa, Kariya (JP)

(73) Assignees: YAZAKI CORPORATION, Tokyo (JP); ADVICS CO., LTD., Kariya (JP)

( * ) Notice: Subject to any disclaimer, the term of this patent is extended or adjusted under 35 U.S.C. 154(b) by 376 days.

(21) Appl. No.: 17/850,121

(22) Filed: Jun. 27, 2022

(65) Prior Publication Data

US 2022/0412381 A1  Dec. 29, 2022

(30) Foreign Application Priority Data

Jun. 28, 2021 (JP) ................. 2021-107031

(51) Int. Cl.
  *H05K 5/00* (2025.01)
  *B29C 45/26* (2006.01)
  (Continued)

(52) U.S. Cl.
  CPC ........ *F15B 21/044* (2013.01); *B29C 45/2628* (2013.01); *B60R 16/0239* (2013.01);
  (Continued)

(58) Field of Classification Search
  CPC ............. B29C 45/2628; B60R 16/0239; B60T 13/686; B60T 17/00; F15B 21/044; H05K 5/0215
  See application file for complete search history.

(56) References Cited

U.S. PATENT DOCUMENTS 9,482,441 B2 * 11/2016 Hara .................... B29C 45/2628
2010/0227543 A1 * 9/2010 Furuyama ........... B29C 66/1224
  454/270

(Continued)

FOREIGN PATENT DOCUMENTS

JP  2010-52613 A  3/2010
JP  2019-8917 A   1/2019

*Primary Examiner* — Abdullah A Riyami
*Assistant Examiner* — Thang H Nguyen
(74) *Attorney, Agent, or Firm* — Sughrue Mion, PLLC

(57) ABSTRACT

A resin molded article has an internal space. The resin molded article includes: a ventilation passage defined to allow the internal space to communicate with an outside of the resin molded article. The ventilation passage includes: a first ventilation passage extending from the internal space in a predetermined direction so as to include a bottom portion; and a second ventilation passage extending from the outside in a direction intersecting the predetermined direction. The first ventilation passage and the second ventilation passage communicate with each other by allowing the bottom portion to communicate with the bifurcated portions provided at an end portion of the second ventilation passage. A portion where the first ventilation passage and the second ventilation passage communicate with each other is narrowest in the ventilation passage.

6 Claims, 9 Drawing Sheets

(51) Int. Cl.
    *B60R 16/00*         (2006.01)
    *B60R 16/023*      (2006.01)
    *F15B 21/044*      (2019.01)
    *H05K 5/02*         (2006.01)
    *B60T 13/68*         (2006.01)
    *B60T 17/00*         (2006.01)

(52) U.S. Cl.
    CPC .......... *H05K 5/0215* (2022.08); *B60T 13/686* (2013.01); *B60T 17/00* (2013.01)

(56) References Cited

U.S. PATENT DOCUMENTS

| | | | |
|---|---|---|---|
| 2012/0273388 A1* | 11/2012 | Kishikawa | H05K 5/068 206/701 |
| 2017/0223854 A1* | 8/2017 | Nishida | H05K 5/069 |
| 2018/0072016 A1* | 3/2018 | Samejima | B32B 27/06 |
| 2018/0376604 A1* | 12/2018 | Ohyama | H05K 5/0213 |

* cited by examiner

RESIN MOLDED ARTICLE, RESIN MOLDED ARTICLE MANUFACTURING METHOD, AND HYDRAULIC CONTROL DEVICE

CROSS-REFERENCE TO RELATED APPLICATIONS

This application is based on and claims priority under 35 USC 119 from Japanese Patent Application No. 2021-107031 filed on Jun. 28, 2021, the contents of which are incorporated herein by reference.

TECHNICAL FIELD

The present disclosure relates to a resin molded article, a manufacturing method of the resin molded article, and a hydraulic control device.

BACKGROUND ART

In the related art, an electronic control unit applicable to a vehicle wire harness and the like is proposed. The electronic control unit includes a substrate, a housing (so-called resin molded article) that houses the substrate in a sealed internal space, and a connector that penetrates the housing and is connected to the substrate.

In general, since the electronic control unit is electrically connected to a counterpart member via the connector, heat may be generated in the substrate. Since the substrate is housed in the sealed internal space of the housing as described above, a temperature difference between the internal space of the housing and an outside of the housing is caused by the heat generated in the substrate. In this way, when the temperature difference occurs between the internal space of the housing and the outside of the housing, pressure may be applied to the internal space of the housing. As a method for relieving the pressure applied to the internal space of the housing, in electronic control units in the related art, for example, the housing is provided with a ventilation portion (so-called ventilation passage) that allows the internal space of the housing to communicate with the outside of the housing (for example, see JP-A-2010-052613 and JP-A-2019-008917).

However, when the housing is provided with the ventilation portion as described above, liquid such as rainwater may infiltrate into the internal space of the housing through the ventilation portion. Therefore, in JP-A-2019-008917, by providing a waterproof filter in an opening on the internal space side of the housing, the infiltration of liquid into the internal space of the housing through the ventilation portion is prevented.

SUMMARY OF INVENTION

However, not only liquid will infiltrate the internal space of the housing through the ventilation portion, but also insects (for example, ants) will intrude the internal space of the housing through the ventilation portion. In this way, when the insects intrude the internal space of the housing, the waterproof filter described above may be damaged by the insects. If the waterproof filter is damaged by the insects that intrude, waterproofness of the electronic control unit will be impaired.

Therefore, as a method for preventing intrusion of insects into the internal space of the housing described above, a method of reducing a size of the ventilation portion is also conceivable. However, it is difficult to make the ventilation portion extremely small since a ventilation amount of the ventilation portion is required to be ensured. As another method, a method of adding an insect repellent part to the opening of the ventilation portion can be considered, but the method will lead to increase of a manufacturing cost of the electronic control unit (that is, the housing) due to the increased number of parts, and complicated manufacturing steps of the electronic control unit (that is, the housing).

The present disclosure is made in view of the above-mentioned situations, and an object thereof is to provide a resin molded article, a manufacturing method of the resin molded article, and a hydraulic control device that can prevent intrusion of insects without increasing the number of parts.

The present disclosure provides a resin molded article having an internal space, the resin molded article including: a ventilation passage defined to allow the internal space to communicate with an outside of the resin molded article, wherein the ventilation passage includes: a first ventilation passage extending from the internal space in a predetermined direction so as to include a bottom portion; and a second ventilation passage extending from the outside in a direction intersecting the predetermined direction, wherein the first ventilation passage and the second ventilation passage communicate with each other by allowing the bottom portion to communicate with the bifurcated portions provided at an end portion of the second ventilation passage, and wherein a portion where the first ventilation passage and the second ventilation passage communicate with each other is narrowest in the ventilation passage.

The present disclosure provides a manufacturing method of the above-described resin molded article, the manufacturing method using a first mold, a second mold separated from and adjacent to the first mold, and a third mold, at least a part of the third mold being located between the first mold and the second mold, wherein the first mold includes a protrusion that protrudes toward the second mold, and the third mold includes bifurcated portions at an end portion of the at least part located between the first mold and the second mold, the manufacturing method including: bringing the protrusion into contact with both of the bifurcated portions to hold the third mold between the first mold and the second mold; injecting resin into a space defined by the first mold, the second mold, and the third mold; pulling out the third mold from between the first mold and the second mold to define the second ventilation passage; and removing the first mold from the second mold to define the first ventilation passage.

The present disclosure provides a hydraulic control device including: a metal housing having an oil passage formed therein; and a resin molded article disposed on one surface of the metal housing, wherein the resin molded article accommodates a substrate in a substrate accommodating portion provided inside the resin molded article, the substrate being configured to control a hydraulic pressure in the oil passage, wherein in the resin molded article, an electric control component configured to control the hydraulic pressure in the oil passage is disposed in an apparatus accommodating portion formed between the metal housing and the substrate accommodating portion, wherein in the resin molded article, a ventilation passage is defined to allow the substrate accommodating portion to communicate with an outside of the resin molded article, wherein the resin molded article includes a filter configured not to allow liquid to pass therethrough and configured to allow gas to pass therethrough, wherein the ventilation passage includes: a first ventilation passage extending from the substrate accommodating portion in a predetermined direction so as to include a bottom portion; and a second ventilation passage extending from the outside in a direction intersecting the predetermined direction, wherein the first ventilation passage and the second ventilation passage communicate with each other by allowing the bottom portion to communicate with bifurcated portions provided at an end portion of the second ventilation passage, wherein a portion where the first ventilation passage and the second ventilation passage communicate with each other is narrowest in the ventilation passage, wherein each of the bifurcated portions is narrower than the first ventilation passage, and wherein the filter is provided so as to cover an opening of the first ventilation passage on a substrate accommodating portion side.

The present disclosure is briefly described above. Details of the present disclosure will be further clarified by reading a configuration for carrying out the invention described below with reference to the accompanying drawings.

DESCRIPTION OF EMBODIMENTS

First Embodiment

Figure 1:
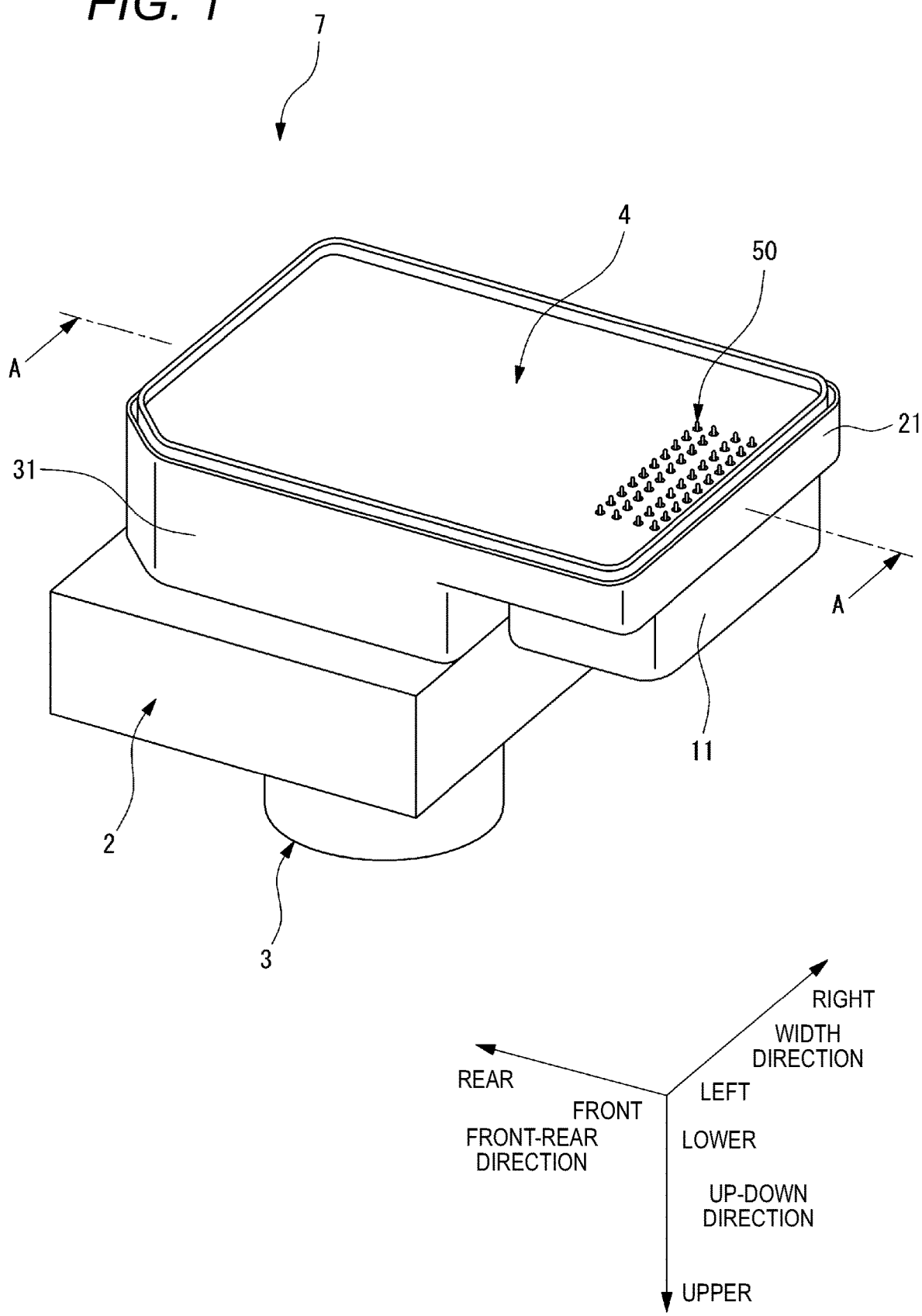
FIG. 1 is a perspective view showing a hydraulic control device according to an embodiment of the present disclosure.
Figure 2:
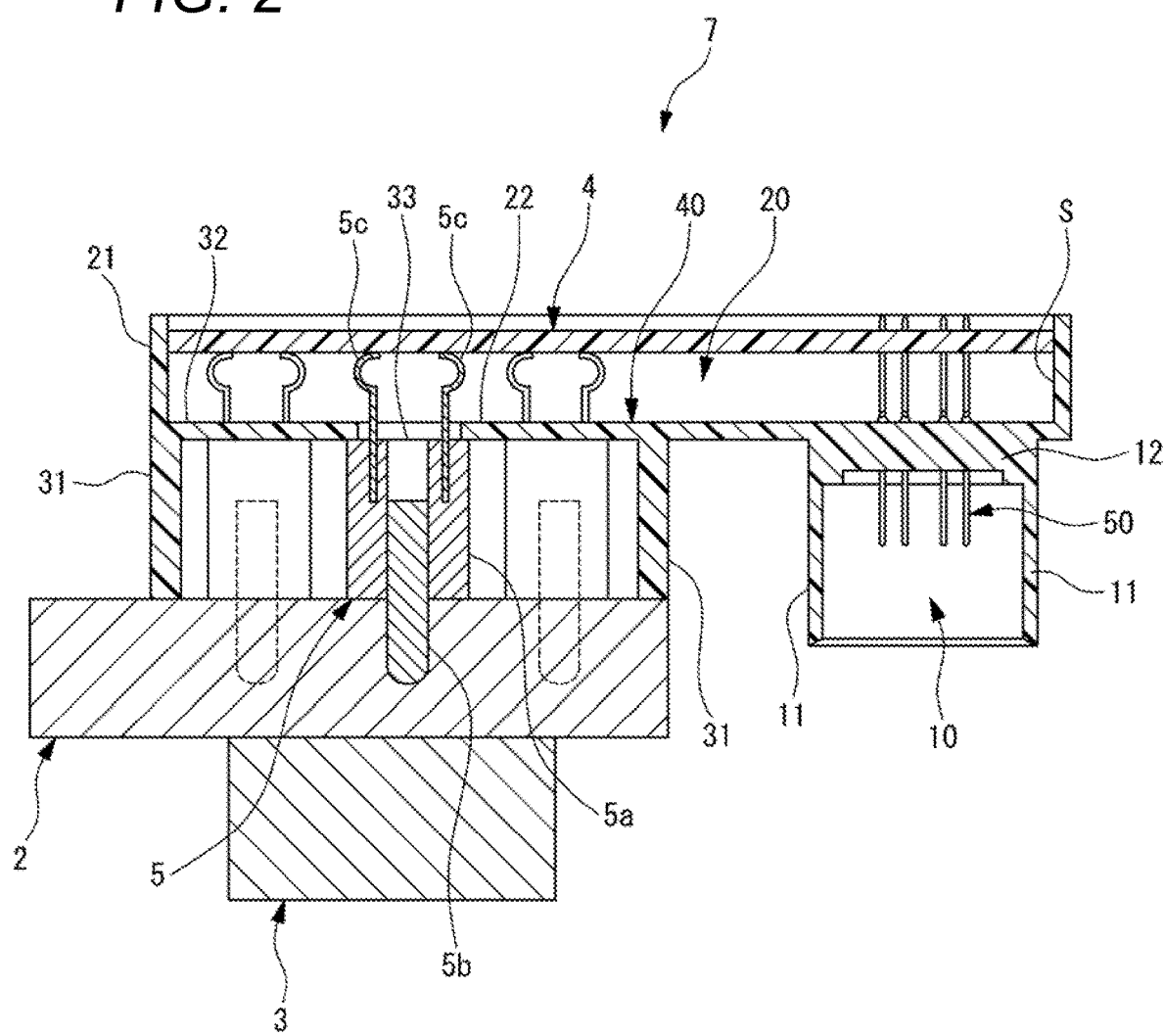
FIG. 2 is a cross-sectional view taken along a line A-A in FIG. 1.
Figure 3A:
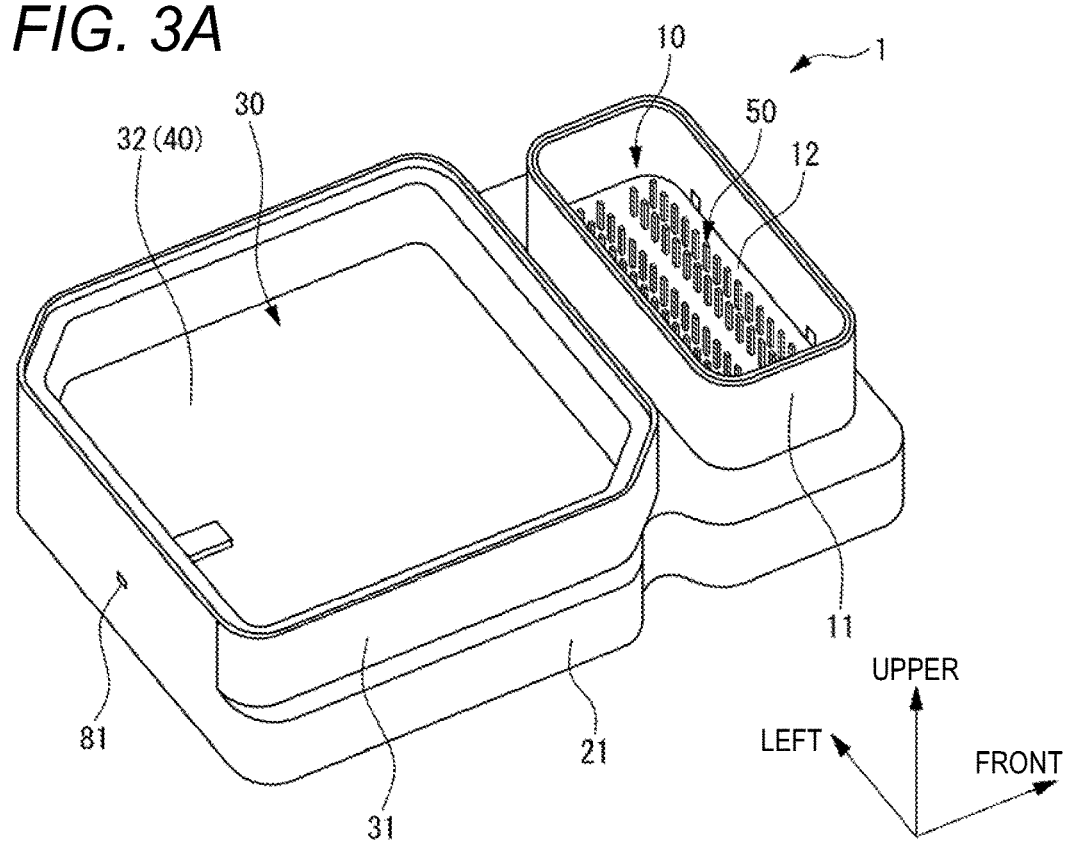
FIG. 3A is a perspective view of the resin molded article according to a first embodiment of the present disclosure as viewed from an upper side.
Figure 3B:
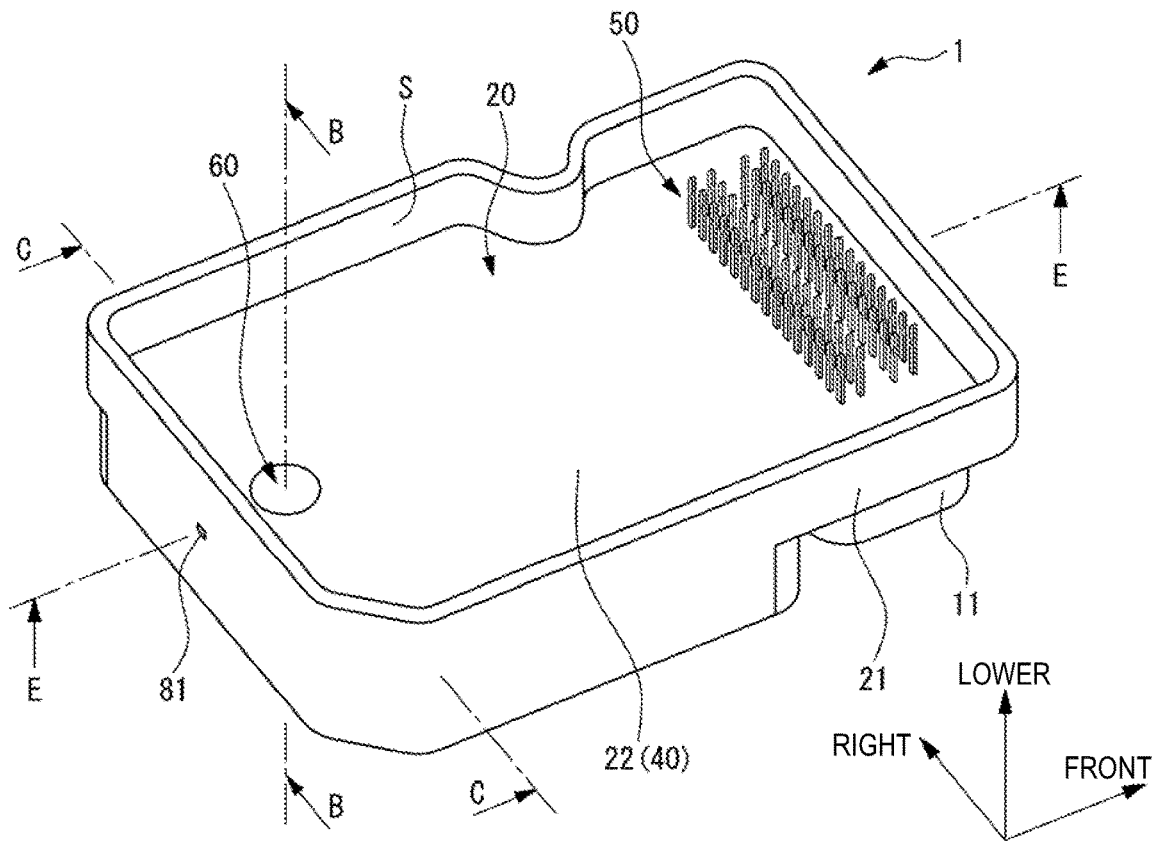
FIG. 3B is a perspective view of the resin molded article according to the first embodiment as viewed from a lower side.

As shown in FIG. 1, a hydraulic control device 7 includes a resin molded article 1 and an actuator unit 2. As shown in FIGS. 1 to 3B (particularly FIGS. 3A and 3B), the resin molded article 1 is a resin molded article integrally including a connector portion 10, a substrate accommodating portion 20, and an apparatus accommodating portion 30. The resin molded article 1 is used, for example, as a part of an antilock brake system (ABS) unit for a vehicle. In such a case, for example, a solenoid coil 5a included in a hydraulic valve 5 is accommodated in the apparatus accommodating portion 30. The resin molded article 1 is fixed to the actuator unit 2 by bolts or the like (not shown).

Hereinafter, for convenience of description, as shown in FIGS. 1 to 9B, "upper", "lower", "front", "rear", "right", "left" are defined. As used herein, an upper-lower direction is also referred to as an "up-down direction", a right-left direction is also referred to as a "width direction". The up-down direction, the width direction, and the front-rear direction are orthogonal to each other.

The resin molded article 1 is attached to a counterpart (not shown), which is located on an upper side of the resin molded article 1, by approaching upward along the up-down direction toward the counterpart. An "attaching direction" of the present disclosure coincides with the up-down direction.

As shown in FIGS. 3A, 3B, 4A and 4B, the resin molded article 1 includes a flat plate-shaped base plate 40 located at a substantially central portion in the up-down direction of the resin molded article 1. On a front portion of an upper surface of the base plate 40, a substantially rectangular cylindrical frame body protruding upward is provided as a side wall 11 of the connector portion 10. An area of the base plate 40 surrounded by the side wall 11 constitutes an inner wall 12 of the connector portion 10.

On a lower surface of a peripheral edge portion of the base plate 40, a cylindrical frame body protruding downward is provided as a side wall 21 of the substrate accommodating portion 20. In other words, the base plate 40 also serves as an inner wall 22 of the substrate accommodating portion 20.

On a rear portion of the upper surface of the base plate 40, a substantially rectangular cylindrical frame body protruding upward is provided as a side wall 31 of the apparatus accommodating portion 30 so as to be arranged at an interval from the rear side of the side wall 11. An area of the base plate 40 surrounded by the side wall 31 constitutes an inner wall 32 of the apparatus accommodating portion 30.

A rear side wall of the resin molded article 1 is formed by integrally molding the side wall 21 of the substrate accommodating portion 20 and the side wall 31 of the apparatus accommodating portion 30. On the rear side wall of the resin molded article 1, an opening 81 of a ventilation passage V (a second ventilation passage 80), which will be described later, is provided at a substantially central portion in the up-down direction.

On the inner wall 12 of the connector portion 10, a large number of terminals 50 extending linearly in the up-down direction are press-fitted to respectively penetrate a large number of through holes (not shown) that penetrate the inner wall 12 in the up-down direction, so as to be fixed. That is, a lower end portion of each terminal 50 is exposed at the substrate accommodating portion 20, and an upper end portion of each terminal 50 is exposed at the connector portion 10.

When a counterpart connector (not shown) is fitted into the connector portion 10 (specifically, a fitting chamber defined by the side wall 11 and the inner wall 12), terminals (female terminal, not shown) provided in the counterpart connector and the terminals 50 are electrically connected to each other.

At each of a plurality of locations on the inner wall 32 of the apparatus accommodating portion 30, a terminal insertion hole 33 (through hole) is formed to allow insertion of a pair of leaf spring-shaped terminals 5c (see FIG. 2) protruding downward from a lower end portion of the solenoid coil 5a.

For example, a substrate 4 is accommodated and fixed in the substrate accommodating portion 20. When the substrate 4 is fixed, the lower end portion of each of the large number of terminals 50 are fixed to the substrate 4 in a state of penetrating each of a large number of through holes (not shown) that penetrate the substrate 4 in the up-down direction. As a result, the terminals 50 and the substrate 4 are electrically connected to each other.

In the resin molded article 1, when the substrate 4 is accommodated in the substrate accommodating portion 20, the substrate 4 becomes a lid that covers the substrate accommodating portion 20. As a result, the substrate accommodating portion 20 and the substrate 4 define an internal space S in the resin molded article 1.

In the apparatus accommodating portion 30, a plurality of solenoid coils 5a are accommodated and fixed such that leaf spring-shaped terminals 5c protruding downward from the solenoid coil 5a pass through the terminal insertion hole 33 and then exposed at the substrate accommodating portion 20.

A lower end portion of each leaf spring-shaped terminal 5c exposed at the substrate accommodating portion 20 is brought into pressure contact with an upper surface of the substrate 4. As a result, each solenoid coil 5a is electrically connected to the counterpart connector mounted on the connector portion 10 via the substrate 4.

The solenoid coil 5a has a cylindrical shape, and in an internal space thereof, a rod-shaped plunger 5b is accommodated so as to be relatively movable in the up-down direction with respect to the solenoid coil 5a by electromagnetic force generated by the solenoid coil 5a. The solenoid coil 5a and the plunger 5b constitute the hydraulic valve 5.

The actuator unit 2 for ABS control is mounted on an upper end surface of the side wall 31 of the apparatus accommodating portion 30 so as to close an opening of the apparatus accommodating portion 30. This mounting is performed by, for example, bolt fastening using a plurality of bolt fastening holes (not shown) provided in the side wall 31.

Although not shown, the actuator unit 2 includes, in a built-in manner, a plurality of valve seat portion of the hydraulic valves 5, a pump for pumping hydraulic oil stored in a reservoir, and the like, and a motor 3 for driving the pump is mounted on an upper surface of the actuator unit 2.

An upper end portion of the plunger 5b accommodated in each solenoid coil 5a is inserted into the valve seat portion of the hydraulic valve 5 in the actuator unit 2. By controlling a position in the up-down direction of the plunger 5b by the electromagnetic force generated by each solenoid coil 5a, the corresponding hydraulic valve 5 is controlled to be opened or closed, and the well-known ABS control is executed.

To briefly describe the ABS control, when a slip ratio of a certain wheel of a vehicle exceeds a predetermined value, the hydraulic valve 5 corresponding to the wheel is controlled so that a brake hydraulic pressure corresponding to the wheel is reduced from a hydraulic pressure corresponding to a brake pedal tread force generated by a master cylinder of the vehicle. As a result, the slip ratio of the wheel is adjusted so as to change to the predetermined value or less. The hydraulic oil returned to the reservoir when the brake hydraulic pressure is reduced is pumped up by the pump driven by the motor 3 and returned to the master cylinder of the vehicle.

Figure 4A:
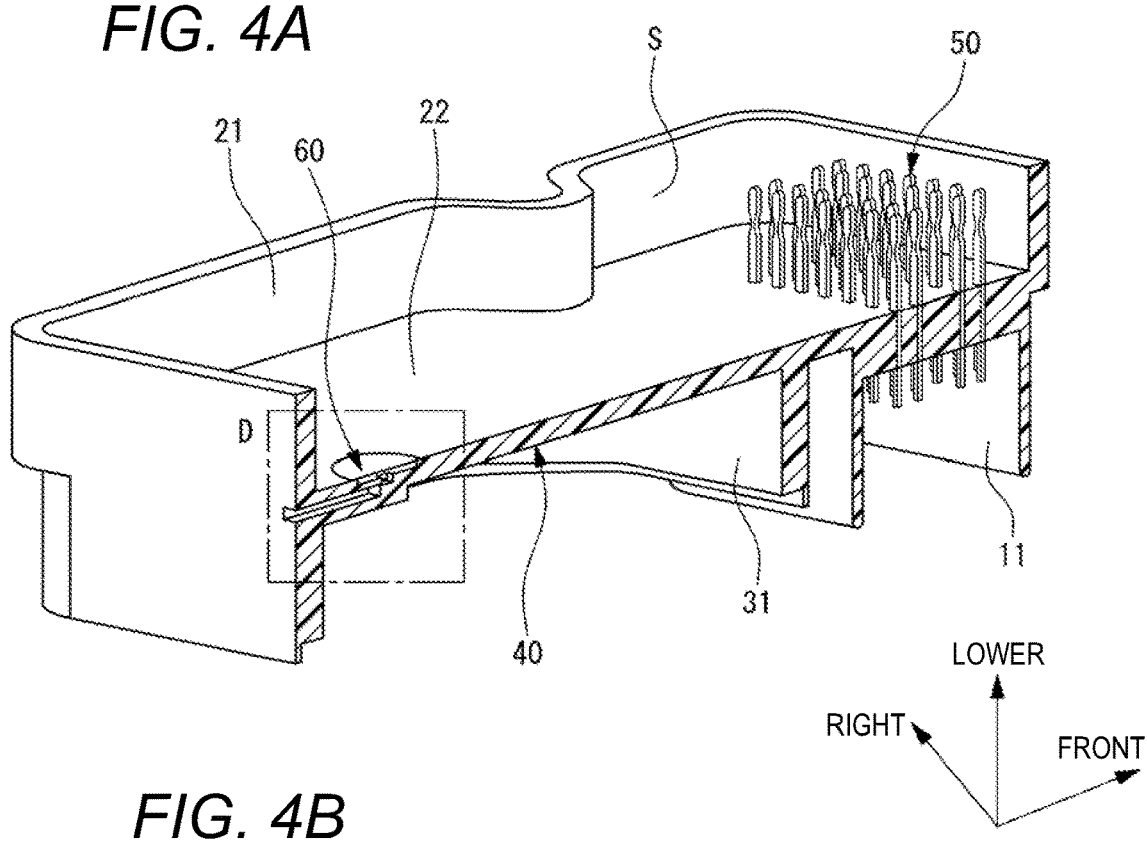
FIG. 4A is a perspective view of a cross section taken along a line B-B in FIG. 3B.
Figure 4B:
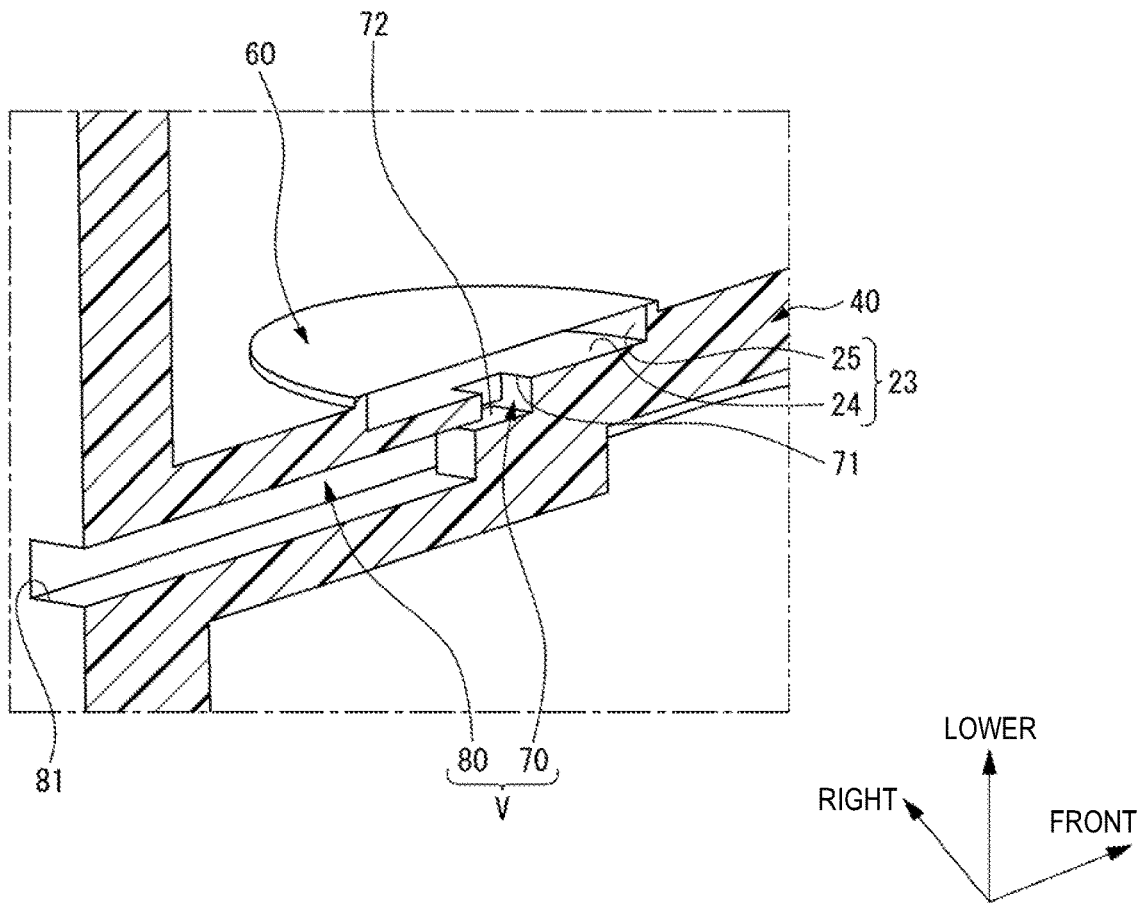
FIG. 4B is an enlarged view of a part D in FIG. 4A.
Figure 5:
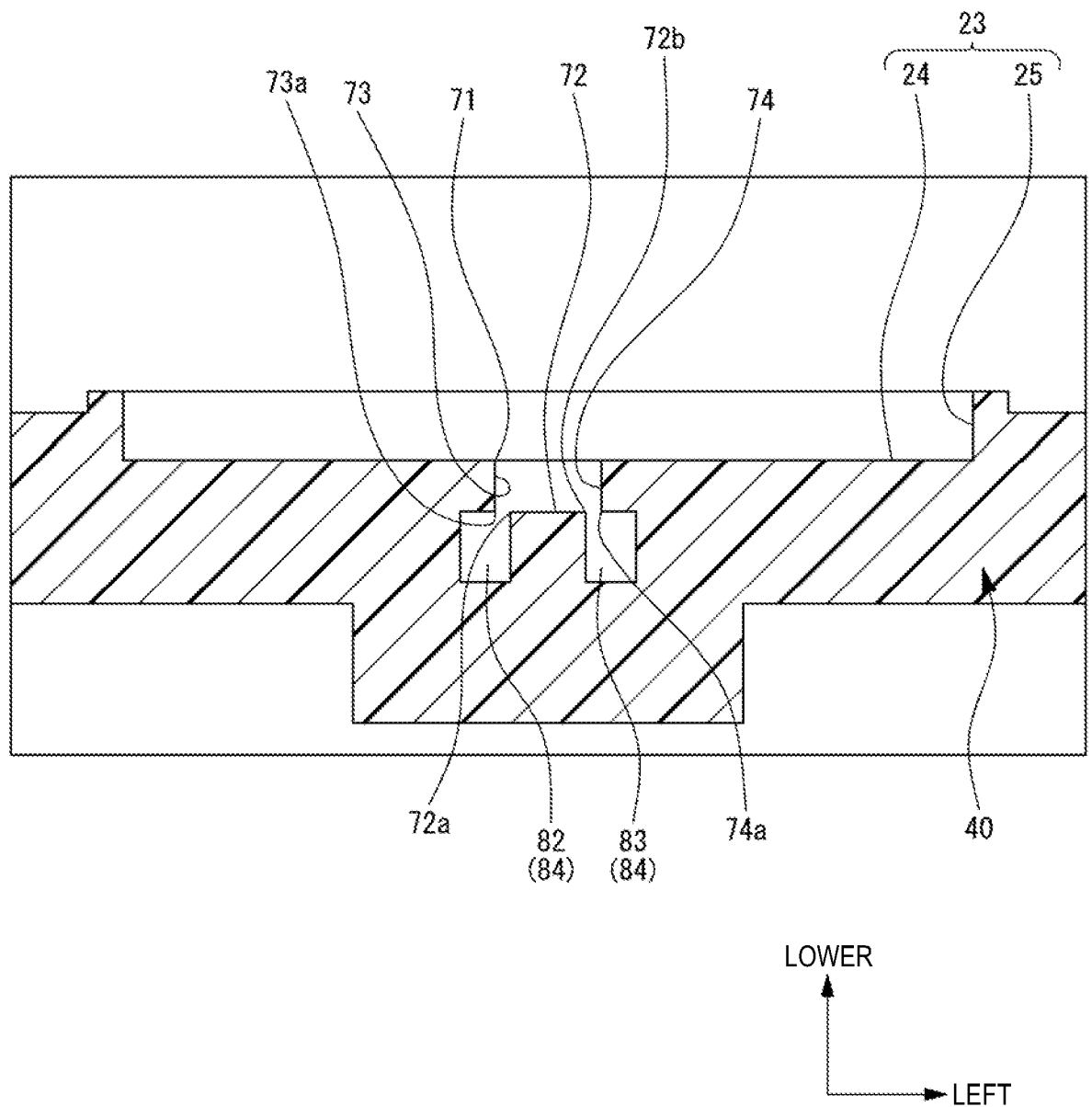
FIG. 5 is an enlarged view of a communication portion in a cross section taken along a line C-C in FIG. 3B.

As shown in FIGS. 4A, 4B and 5, the inner wall 22 of the substrate accommodating portion 20 is provided with a substantially cylindrical recess 23 that is recessed upward. The recess 23 includes a bottom wall 24 and a peripheral wall 25. The bottom wall 24 is provided with an opening 71 of a first ventilation passage 70, which will be described later. A filter 60, which will be described later, is provided at a lower end portion of the peripheral wall 25.

As shown in FIGS. 3A, 3B, 4A, and 4B, in the resin molded article 1, the filter 60 having a substantially circular shape is provided at the lower end portion of the peripheral wall 25 so as to cover the opening 71 of the first ventilation passage 70. The filter 60 is attached to the lower end portion of the peripheral wall 25 by, for example, welding. As the filter 60, various types of material that do not allow liquids such as water to permeate and allow gas such as air to permeate, such as a porous membrane, a microporous membrane, and a microporous structural material, can be used.

In the resin molded article 1, the ventilation passage V that allows the internal space S to communicate with an outside of the resin molded article 1 is defined in the base plate 40. The ventilation passage V includes the first ventilation passage 70 extending in the up-down direction from the internal space S, and the second ventilation passage 80 extending in the front-rear direction from the outside of the resin molded article 1. In the present embodiment, the up-down direction corresponds to a predetermined direction, and the front-rear direction corresponds to a direction intersecting the predetermined direction.

As shown in FIGS. 4A, 4B and 5, the first ventilation passage 70 extends from the inner wall 22 of the substrate accommodating portion 20 (that is, the internal space S) toward the upper side in the up-down direction so as to include a bottom portion 72. The first ventilation passage 70 has a substantially rectangular parallelepiped shape (see FIG. 5 in particular). As shown in FIG. 5, the first ventilation passage 70 is configured to have a length in the width direction to be larger than a length of the bottom portion 72 in the width direction.

The second ventilation passage 80 extends from the rear side wall of the resin molded article 1 (that is, the outside of the resin molded article 1) toward the front side along the front-rear direction. The second ventilation passage 80 has a substantially rectangular parallelepiped shape (see FIGS. 4A and 4B in particular).

At a front end portion of the second ventilation passage 80, bifurcated portions 84 including a first portion 82 having a substantially rectangular parallelepiped shape extending along the front-rear direction and a second portion 83 having a substantially rectangular parallelepiped shape extending along the front-rear direction, are provided. In the bifurcated portions 84, the first portion 82 and the second portion 83 are separated from each other with a predetermined interval in the width direction.

Each of the first portion 82 and the second portion 83 is configured to be narrower than the first ventilation passage 70. Specifically, a passage area of each of the first portion 82 and the second portion 83 is smaller than a passage area of the first ventilation passage 70. The passage area refers to a cross-sectional area obtained by cutting the ventilation passage V by a plane perpendicular to an axis of the passage area V, which is an air flow direction. However, since communication portions C are holes having a substantially rectangular shape elongated in the front-rear direction as described later, an area of the communication portion C is equal to the passage area.

In the ventilation passage V, as shown in FIG. 5 in particular, the bottom portion 72 of the first ventilation passage 70 and the bifurcated portions 84 of the second ventilation passage 80 communicate with each other, so that the first ventilation passage 70 and the second ventilation passage 80 communicate with each other. Specifically, a lower left edge portion of the first portion 82 and an upper right edge portion of a space of the first ventilation passage 70 including the bottom portion 72 communicate with each other in the up-down direction so that the space of the first portion 82 and the space of the first ventilation passage 70 slightly overlap in the width direction.

Similarly, a lower right edge portion of the second portion 83 and an upper left edge portion of the space of the first ventilation passage 70 including the bottom portion 72 communicate with each other in the up-down direction so that the space of the second portion 83 and the space of the first ventilation passage 70 slightly overlap in the width direction.

In this way, in the ventilation passage V, the space of the first ventilation passage 70 and each space of the first portion 82 and the second portion 83 slightly overlap with each other, so as to form the communication portions C in which the bottom portion 72 of the first ventilation passage 70 and the bifurcated portions 84 of the second ventilation passage 80 communicate with each other in the up-down direction.

Figure 6:
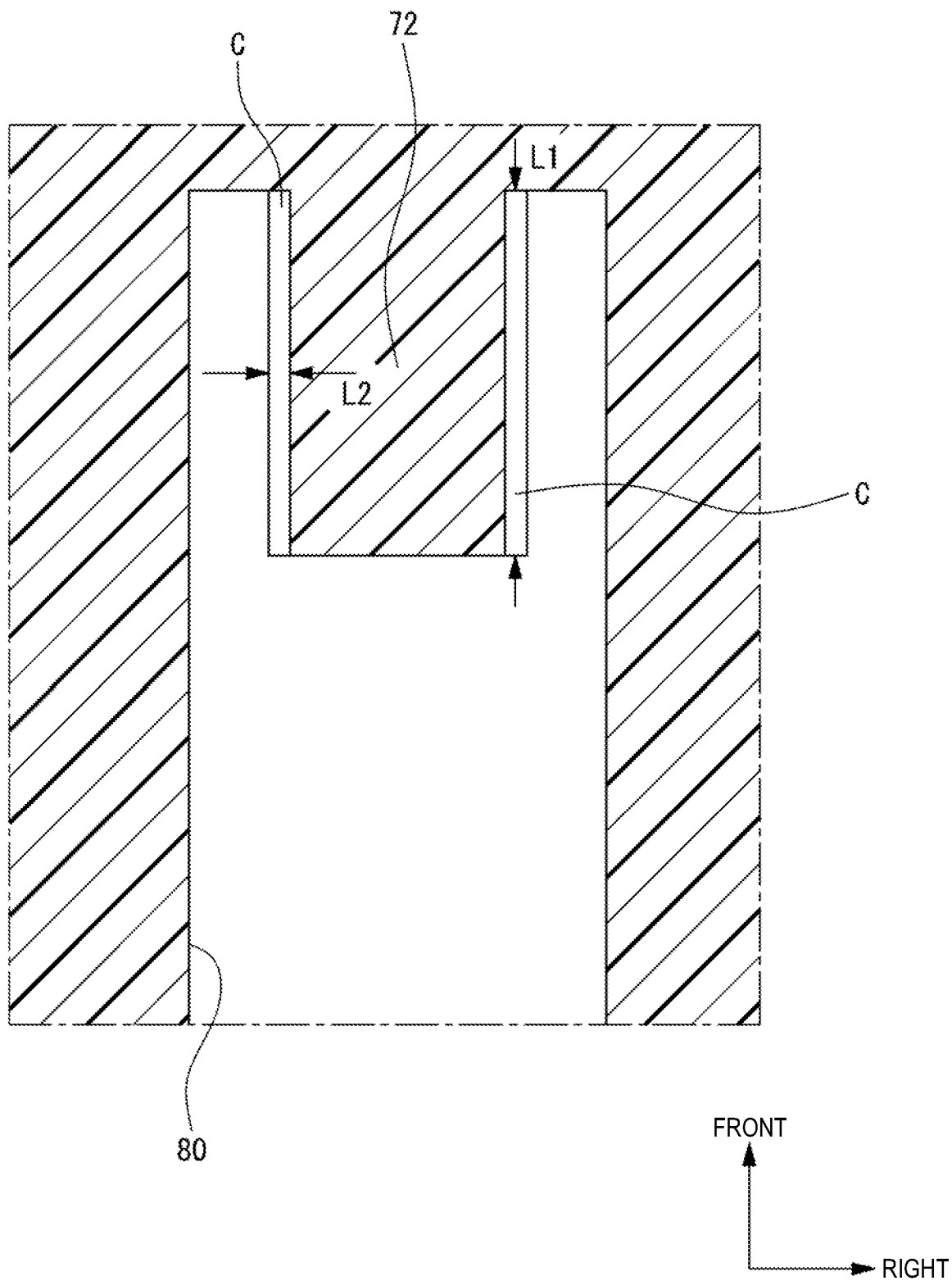
FIG. 6 is an enlarged view of the communication portion in a cross section taken along a line E-E in FIG. 3B.

As shown in FIG. 6, each of the communication portions C has a length in the front-rear direction and a length in the width direction. The communication portion C is a hole having a substantially rectangular shape elongated in the front-rear direction (see FIG. 6). That is, the communication portion C is configured to have the length L1 in the front-rear direction to be longer than the length L2 in the width direction. The communication portion C is preferably designed so that a length of a shorter side thereof (in the present embodiment, the length L2 in the width direction) is 0.25 mm or less. For example, when the length L1 in the front-rear direction and the length L2 in the width direction are equal (that is, the communication portion C is a hole having a substantially square shape), it is preferable that the length L1 in the front-rear direction and the length L2 in the width direction are both designed to be 0.25 mm or less.

In other words, the communication portion C on the right side (see FIG. 6) is a gap in the width direction between an upper corner portion 73a of a side wall 73 defining the first ventilation passage 70 and a right corner portion 72a of the bottom portion 72. The communication portion C on the left side (see FIG. 6) is a gap in the width direction between an upper corner portion 74a of a side wall 74 defining the first ventilation passage 70 and a left corner portion 72b of the bottom portion 72.

The communication portion C is configured to be the narrowest in the ventilation passage V. Specifically, the communication portion C is configured to have the smallest passage area among the passage areas in the ventilation passage V, and is also configured in a shape so that insects (particularly ants) that intrude the second ventilation passage 80 cannot intrude the first ventilation passage 70 (that is, the internal space S).

With the above configuration, the resin molded article 1 can prevent the insects from intruding by narrowing the communication portion C between the first ventilation passage 70 and the second ventilation passage 80 while ensuring a ventilation amount in the ventilation passage V. The above is the description of the resin molded article 1 according to the first embodiment.

Figure 7A:
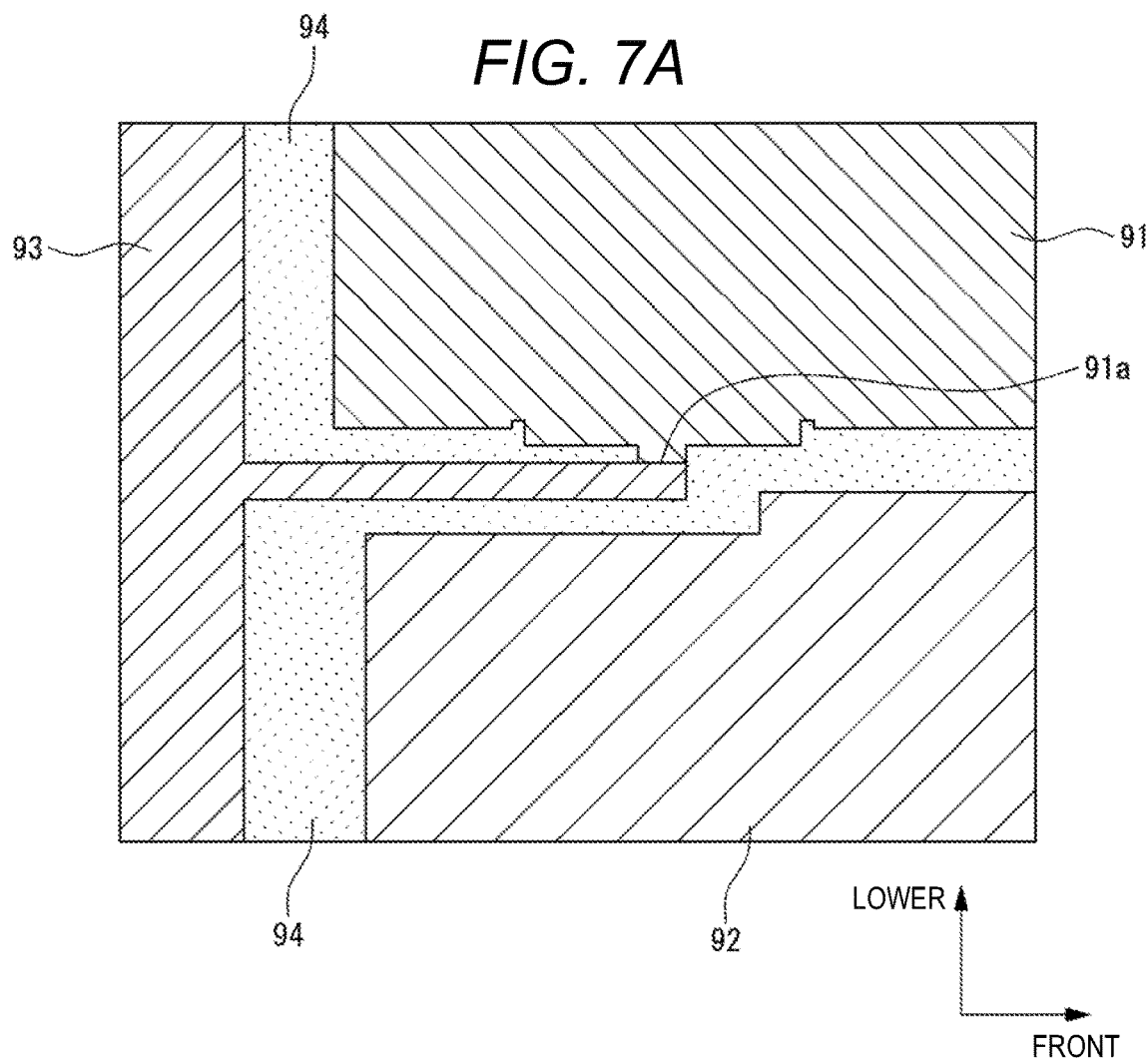
FIG. 7A is a view showing a manufacturing method of the resin molded article according to the present embodiment, which corresponds to the cross section taken along the line B-B in FIG. 3B.

Next, a manufacturing method of the resin molded article 1 according to the first embodiment will be described. As shown in FIG. 7A, the resin molded article 1 is manufactured using a first mold 91, a second mold 92 separated from the first mold 91 and adjacent to the first mold 91 in the up-down direction, and a third mold 93 including at least a part located between the first mold 91 and the second mold 92.

The first mold 91 includes a protrusion 91a that protrudes toward the second mold 92 (that is, toward the upper side along the up-down direction). The protrusion 91a has a substantially rectangular parallelepiped shape extending in the up-down direction, and defines the first ventilation passage 70 through a manufacturing step described later.

The third mold 93 includes a bifurcated portions 93a at a front end portion of the part located between the first mold 91 and the second mold 92. A length between one of the bifurcated portions 93a of the third mold 93 and the other of the bifurcated portions 93a of the third mold 93 is shorter than a length in the width direction of the protrusion 91a. The part of the third mold 93 located between the first mold 91 and the second mold 92 has a substantially rectangular parallelepiped shape extending in the front-rear direction, and defines the second ventilation passage 80 by a manufacturing step described later. Similarly, the bifurcated portions 93a of the third mold 93 define the bifurcated portions 84 of the second ventilation passage 80 through a manufacturing step described later. A length of each of the bifurcated portions 93a in the front-rear direction corresponds to a length of the protrusion 91a in the front-rear direction.

Figure 7B:
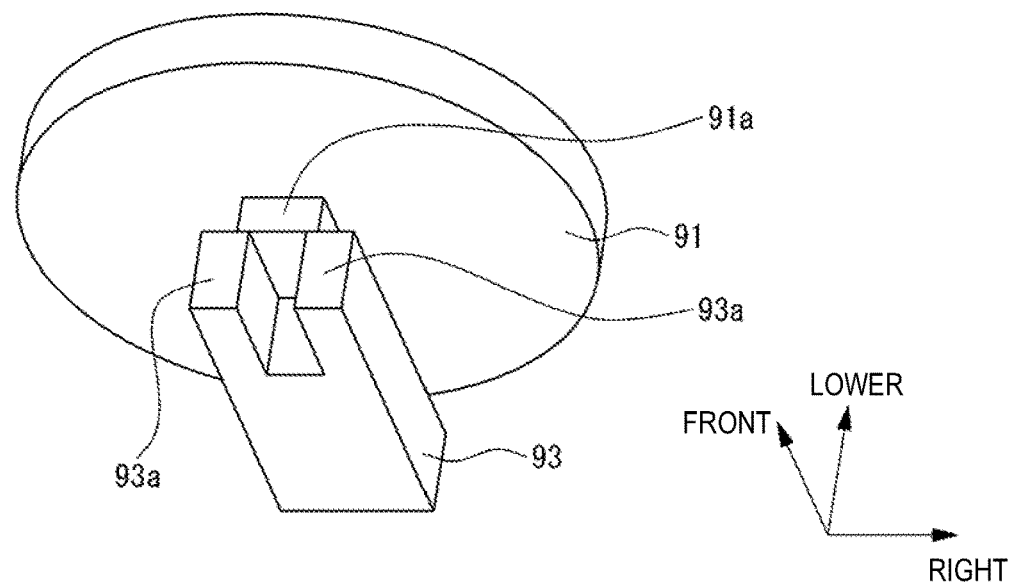
FIG. 7B is a perspective view of a first member and a third member as viewed from the upper side.

In the manufacturing method of the resin molded article 1, first, the protrusion 91a is brought into contact with both of the bifurcated portions 93a, and the third mold 93 is held between the first mold 91 and the second mold 92. Specifically, as shown in FIG. 7B, the third mold 93 is arranged so that a right edge portion of a lower surface of the left bifurcated portion 93a and a left edge portion of an upper surface of the protrusion 91a are in contact with each other in the width direction to allow the bifurcated portion 93a and the protrusion 91a slightly contact each other, and a left edge portion of a lower surface of the right bifurcated portion 93a and a right edge portion of the upper surface of the protrusion 91a are in contact with each other in the width direction to allow the bifurcated portion 93a and the protrusion 91a slightly contact each other. These contact portions have a substantially rectangular shape elongated in the front-rear direction.

As described above, by bringing the protrusion 91a into slight contact with the bifurcated portions 93a, a space where the space of the first ventilation passage 70 and the first portion 82 slightly overlap, and a space where the first ventilation passage 70 and the second portion 83 slightly overlap will be defined through a step described later. That is, the contact portions between the protrusion 91a and the bifurcated portions 93a form the communication portions C between the first ventilation passage 70 and the second ventilation passage 80.

Then, resin material 94 is injected into a space defined by the first mold 91, the second mold 92, and the third mold 93. The heat-melted resin material 94 is evenly injected into the above-mentioned space, and then the resin material 94 is cooled and solidified.

Then, the third mold 93 is slid rearward and pulled out from between the first mold 91 and the second mold 92. As a result, the second ventilation passage 80 is defined. Then, the first mold 91 is removed from the second mold 92. As a result, the first ventilation passage 70 is defined and the substrate accommodating portion 20 is formed. Then, the second mold 92 is removed from the resin material 94. As a result, the connector portion 10 and the apparatus accommodating portion 30 are formed. As a result, the resin molded article 1 according to the first embodiment is obtained. The steps of removing the molds after injecting the resin material 94 are not limited to the above-mentioned order.

In the manufacturing method of the resin molded article 1 of the present embodiment, as described above, the contact portions between the protrusion 91a and the bifurcated portions 93a are formed by bringing surfaces into contact with each other in the up-down direction (that is, formed by mating surfaces). For example, in a case where the contact portions between the protrusion 91a and the bifurcated portions 93a are formed by corners thereof, when the resin material 94 is injected as described later, the resin material 94 moves at a high speed in a space to which the resin material is injected, and thus may collide with the mold (that is, the mold is urged by the resin material 94). As a result, force is concentrated on the corners that form the contact portions, which may lead to damage to the mold such as scraping of the corners. However, in the present embodiment, since the surfaces are brought into contact with each other, the damage to the mold as described above can be prevented.

Further, for example, when an attempt is made to define the first ventilation passage 70 and the second ventilation passage 80 with a single mold, a thickness of portions defining the communication portions C in the mold is thin. Therefore, similarly to the above, there is a risk that the thin portions of the mold may be damaged. However, in the manufacturing method of the resin molded article 1 of the present embodiment, since the ventilation passage V is defined by the plurality of molds, the damage to the mold as described above can be prevented.

The above is the description of the manufacturing method of the resin molded article 1 according to the first embodiment.

Second Embodiment

Next, the resin molded article 1 according to a second embodiment will be described. The first mold and the third mold used for manufacturing the resin molded article 1 are different between the second embodiment and the first embodiment. Therefore, a shape of the ventilation passage V is also different between the second embodiment and the first embodiment. Since the second embodiment and the first embodiment are configured in the same manner except for the above-mentioned points, description of the similarly configured points will be omitted. Hereinafter, the second embodiment will be described.

Figure 8A:
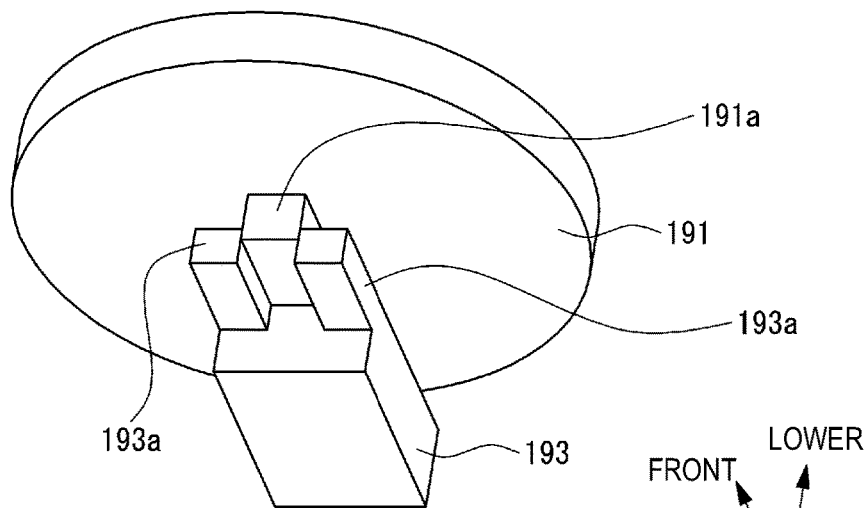
FIG. 8A is a view showing a manufacturing method of a resin molded article according to a second embodiment of the present disclosure, which corresponds to FIG. 7B.

As shown in FIG. 8A, a first mold 191 includes a protrusion 191a protruding toward a second mold (not shown), similarly to the first mold 91. The protrusion 191a protrudes more upward as compared with the protrusion 91a.

A third mold 193 includes bifurcated portions 193a at a front end portion of a portion located between the first mold 191 and the second mold. A length between one of the bifurcated portions 193a of the third mold 193 and the other of the bifurcated portions 193a of the third mold 193 is equal to a length in the width direction of the protrusion 191a. Each of the bifurcated portions 193a has a smaller thickness than the portion of the third mold 193 excluding the bifurcated portions 193a and located between the first mold 191 and the second mold of the third mold 193.

In a manufacturing method of the resin molded article 1 according to the second embodiment, similar to the first embodiment, the protrusion 191a is brought into contact with both of the bifurcated portions 193a, and then the third mold 193 is held between the first mold 191 and the second mold. In this case, in the second embodiment, a form of contact between the protrusion 191a and the bifurcated portions 193a is different from that in the first embodiment.

Specifically, in the second embodiment, the third mold 193 is arranged so that a lower edge portion of the right surface of the left bifurcated portion 193a and an upper edge portion of a left surface of the protrusion 191a are in contact with each other in the up-down direction to allow the bifurcated portion 193a and the protrusion 191a slightly contact each other, and a lower edge portion of the left surface of the right bifurcated portion 193a and an upper edge portion of the right surface of the protrusion 191a are in contact with each other in the up-down direction to allow the bifurcated portion 93a and the protrusion 91a slightly contact each other. That is, the bifurcated portions 193a are arranged so as to sandwich the protrusion 191a. These contact portions have a substantially rectangular shape elongated in the front-rear direction.

Since subsequent steps are the same as those in the first embodiment, description thereof will be omitted.

As described above, by bringing the protrusion 191a into slight contact with the bifurcated portions 193a, a space where a space of a first ventilation passage 170 and a first portion 182, which will be described later, slightly overlap, and a space where the first ventilation passage 170 and a second portion 183 slightly overlap will be defined through a subsequent step. That is, the contact portions between the protrusion 191a and the bifurcated portions 193a form communication portions between the first ventilation passage 170 and a second ventilation passage 180, which will be described later.

Figure 8B:
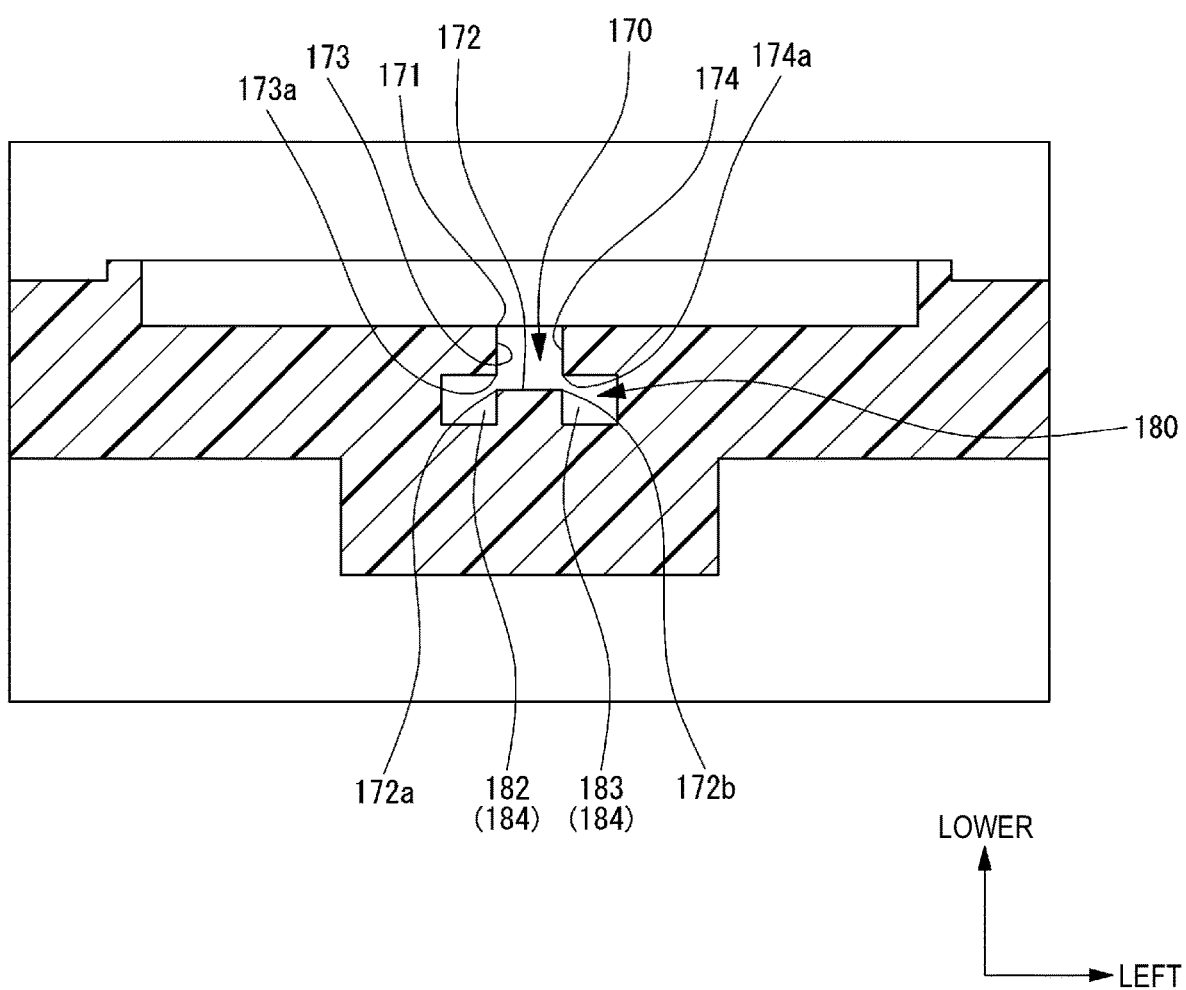
FIG. 8B is a view corresponding to FIG. 5 of the resin molded article according to the second embodiment.

As shown in FIG. 8B, the ventilation passage V includes the first ventilation passage 170 and the second ventilation passage 180. Similar to the first embodiment, the first ventilation passage 170 extends from the inner wall 22 of the substrate accommodating portion 20 (that is, the internal space S) toward the upper side in the up-down direction so as to include a bottom portion 172.

Similar to the first embodiment, the second ventilation passage 180 extends from the rear side wall of the resin molded article 1 (that is, the outside of the resin molded article 1) toward the front side along the front-rear direction. At a front end portion of the second ventilation passage 180, bifurcated portions 184 including a first portion 182 and a second portion 183 are provided. In the bifurcated portions 184, the first portion 182 and the second portion 183 are separated from each other with a predetermined interval in the width direction. This predetermined interval has a length between one of the bifurcated portions 193a of the third mold 193 and the other of the bifurcated portions 193a of the third mold 193.

Each of the first portion 182 and the second portion 183 is configured to be narrower than the first ventilation passage 170. Specifically, a passage area of each of the first portion 182 and the second portion 183 is smaller than a passage area of the first ventilation passage 170.

In the ventilation passage V, the bottom portion 172 of the first ventilation passage 170 and the bifurcated portions 184 of the second ventilation passage 180 communicate with each other, so that the first ventilation passage 170 and the second ventilation passage 180 communicate with each other. Specifically, a lower edge portion of a left portion of the first portion 182 and an upper edge portion of a right portion of the space of the first ventilation passage 170 including the bottom portion 172 communicate with each other in the width direction so that the space of the first portion 182 and the space of the first ventilation passage 170 slightly overlap in the up-down direction.

Similarly, a lower edge portion of a right portion of the second portion 183 and an upper edge portion of a left portion of the space of the first ventilation passage 170 communicate with each other in the width direction so that the space of the second portion 183 and the space of the first ventilation passage 170 slightly overlap in the up-down direction.

In this way, in the ventilation passage V, the space of the first ventilation passage 170 and each space of the first portion 182 and the second portion 183 slightly overlap with each other, so as to form the communication portions in which the bottom portion 172 of the first ventilation passage 170 and the bifurcated portions 184 of the second ventilation passage 180 communicate with each other in the width direction.

Each of the communication portions has a length in the front-rear direction and a length in the up-down direction. The communication portion is a hole having a substantially rectangular shape elongated in the front-rear direction. That is, the communication portion is configured to have the length in the front-rear direction to be longer than the length in the up-down direction. The communication portion is preferably designed so that a length of a shorter side thereof (in the present embodiment, the length in the up-down direction) is 0.25 mm or less. For example, when the length in the front-rear direction and the length in the up-down direction are equal (that is, the communication portion is a hole having a substantially square shape), it is preferable that the length in the front-rear direction and the length in the up-down direction are both designed to be 0.25 mm or less.

In other words, the communication portion on the right side is a gap in the up-down direction between an upper corner portion 173a of a side wall 173 defining the first ventilation passage 170 and a right corner portion 172a of the bottom portion 172. The communication portion on the left side is a gap in the up-down direction between an upper corner portion 174a of a side wall 174 defining the first ventilation passage 170 and a left corner portion 172b of the bottom portion 172.

Similar to the first embodiment, each of the communication portions between the first ventilation passage 170 and the second ventilation passage 180 is configured to be the narrowest in the ventilation passage V. Specifically, the communication portion is configured to have the smallest passage area among the passage areas in the ventilation passage V, and is also configured in a shape so that insects (particularly ants) that intrude the second ventilation passage 180 cannot intrude the first ventilation passage 170 (that is, the internal space S). The ventilation passage V of the second embodiment is smaller in the up-down direction and larger in the width direction than the ventilation passage V of the first embodiment. In this way, the shape of the ventilation passage V of the second embodiment is different from the shape of the ventilation passage V of the first embodiment.

The above is the description of the second embodiment. As described above, the description of the points configured in the same manner as in the first embodiment is omitted.

Third Embodiment

Next, the resin molded article 1 according to a third embodiment will be described. The first mold and the third mold used for manufacturing the resin molded article 1 are different between the third embodiment and the first embodiment. Therefore, the shape of the ventilation passage V is also different between the third embodiment and the first embodiment. Since the third embodiment and the first embodiment are configured in the same manner except for the above-mentioned points, description of the similarly configured points will be omitted. Hereinafter, the third embodiment will be described.

Figure 9A:
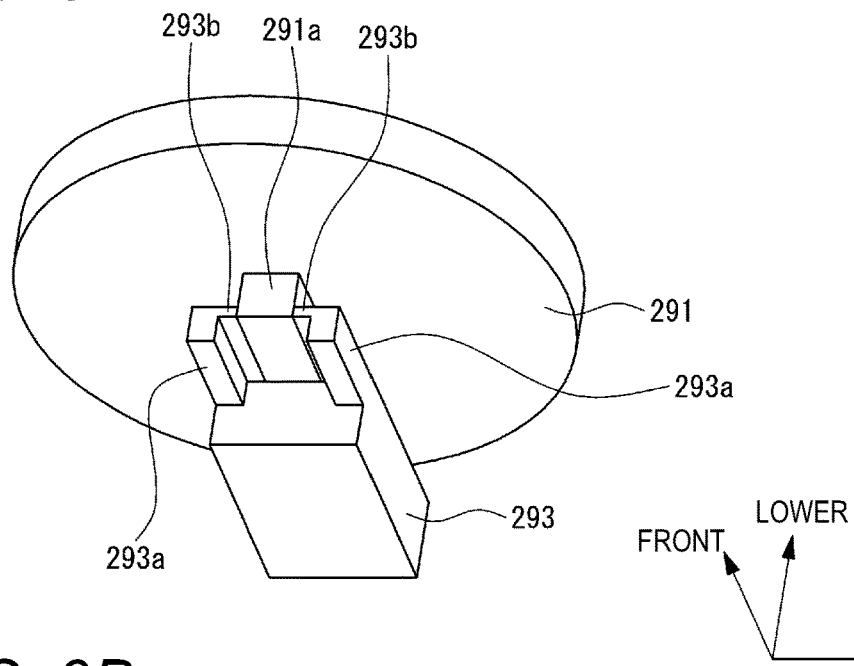
FIG. 9A is a view showing a manufacturing method of a resin molded article according to a third embodiment of the present disclosure, which corresponds to FIG. 7B.

As shown in FIG. 9A, a first mold 291 includes a protrusion 291a protruding toward a second mold (not shown), similarly to the first mold 91. The protrusion 291a protrudes more upward as compared with the protrusion 91a.

A third mold 293 includes bifurcated portions 293a at a front end portion of a portion located between the first mold 291 and the second mold. Each of the bifurcated portions 293a includes an extension portion 293b. Specifically, one of the bifurcated portions 293a (a left bifurcated portion 293a) includes the extension portion 293b extending from a surface facing the other of the bifurcated portions 293a (that is, a right surface) toward the other of the bifurcated portions 293a (a right bifurcated portion 293a) along the width direction, and the other of the bifurcated portions 293a (a right bifurcated portion 293a) includes the extension portion 293b that extends from a surface facing the one of the bifurcated portions 293a (that is, a left surface) toward the one of the bifurcated portions 293a (the left bifurcated portion 293a) along the width direction. That is, each of the bifurcated portions 293a has a substantially L-shaped shape by including the extension portion 293b.

A length between the one of the bifurcated portions 293a of the third mold 293 and the other of the bifurcated portions 293a of the third mold 293 (that is, a length between one extension portion 293b and the other extension portion 293b) is equal to a length of the protrusion 291a in the width direction. Each of the bifurcated portions 293a has a smaller thickness than the portion of the third mold 293 excluding the bifurcated portion 293a and located between the first mold 291 and the second mold of the third mold 293.

In a manufacturing method of the resin molded article 1 according to the third embodiment, similar to the first embodiment, the protrusion 291a is brought into contact with both of the bifurcated portions 293a (that is, the extension portions 293b), and then the third mold 293 is held between the first mold 291 and the second mold. In this case, in the third embodiment, a form of contact between the protrusion 291a and the bifurcated portions 293a is different from that in the first embodiment. Specifically, in the third embodiment, the third mold 293 is arranged so that a free end surface of the extension portion 293b of the left bifurcated portion 293a and an upper edge portion of a left surface of the protrusion 291a are in contact with each other in the up-down direction to allow the bifurcated portion 293a and the protrusion 291a slightly contact each other, and a free end surface of the extension portion 293b of the right bifurcated portion 293a and an upper edge portion of a right surface of the protrusion 291a are in contact with each other in the up-down direction to allow the bifurcated portion 293a and the protrusion 291a slightly contact each other. That is, the extension portions 293b are arranged so as to sandwich the protrusion 291a. These contact portions have a substantially rectangular shape elongated in the front-rear direction.

Since subsequent steps are the same as those in the first embodiment, description thereof will be omitted.

As described above, by bringing the protrusion 291a into slight contact with the bifurcated portions 293a, a space where a space of a first ventilation passage 270 and a first portion 282, which will be described later, slightly overlap, and a space where the first ventilation passage 270 and a second portion 283 slightly overlap will be defined through a subsequent step. That is, the contact portions between the protrusion 291a and the bifurcated portions 293a form communication portions between the first ventilation passage 270 and a second ventilation passage 280, which will be described later.

Figure 9B:
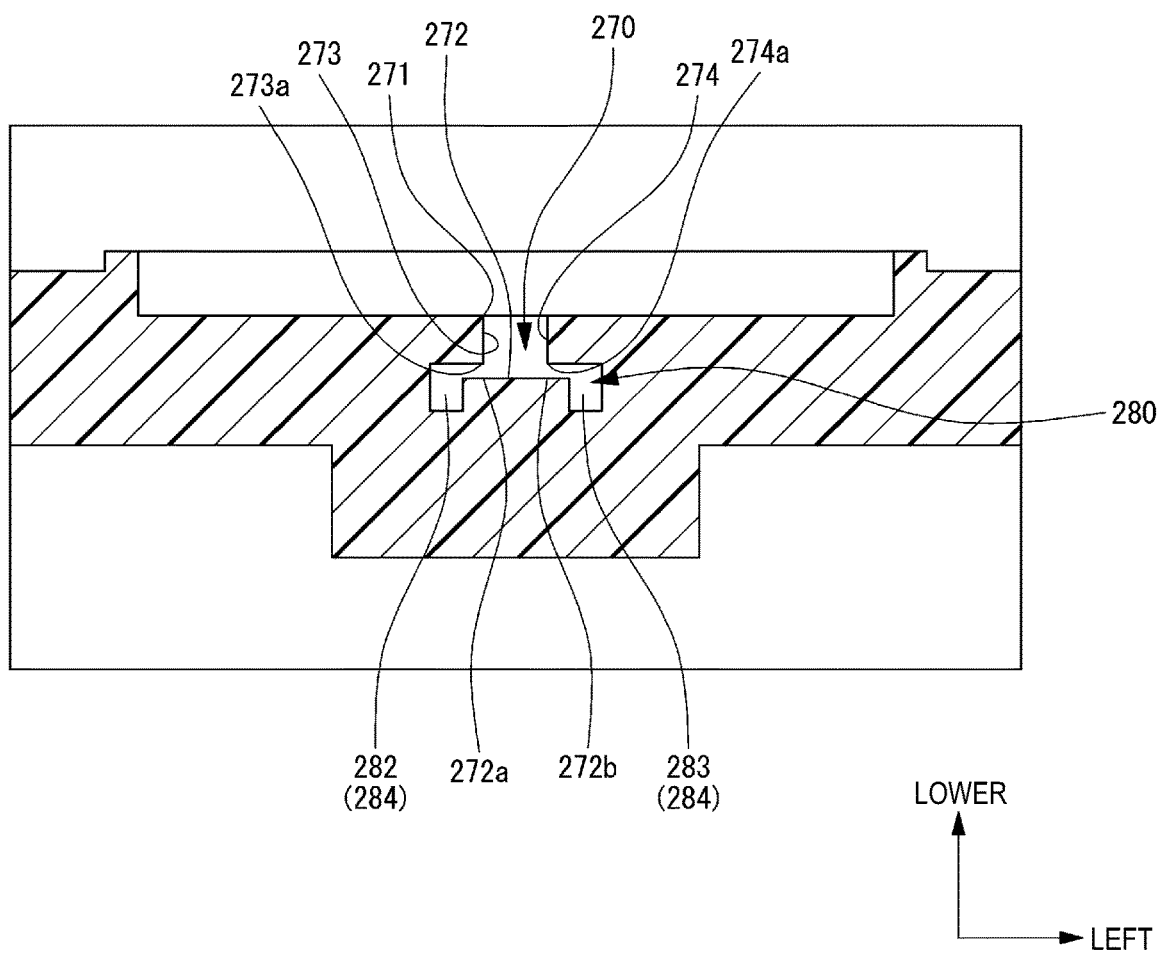
FIG. 9B is a view corresponding to FIG. 5 of the resin molded article according to the third embodiment.

As shown in FIG. 9B, the ventilation passage V includes the first ventilation passage 270 and the second ventilation passage 280. Similar to the first embodiment, the first ventilation passage 270 extends from the inner wall 22 of the substrate accommodating portion 20 (that is, the internal space S) toward the upper side in the up-down direction so as to include a bottom portion 272.

Similar to the first embodiment, the second ventilation passage 280 extends from the rear side wall of the resin molded article 1 (that is, the outside of the resin molded article 1) toward the front side along the front-rear direction. At a front end portion of the second ventilation passage 280, bifurcated portions 284 including a first portion 282 and a second portion 283 are provided. In the bifurcated portions 284, the first portion 282 and the second portion 283 are separated from each other with a predetermined interval in the width direction. This predetermined interval has a length between one of the bifurcated portions 293a of the third mold 293 and the other of the bifurcated portions 293a of the third mold 293.

Each of the first portion 282 and the second portion 283 is configured to be narrower than the first ventilation passage 270. Specifically, a passage area of each of the first portion 282 and the second portion 283 is smaller than a passage area of the first ventilation passage 270.

In the ventilation passage V, the bottom portion 272 of the first ventilation passage 270 and the bifurcated portions 284 of the second ventilation passage 280 communicate with each other, so that the first ventilation passage 270 and the second ventilation passage 280 communicate with each other. Specifically, a left side of a portion of the first portion 282 extending along the width direction and an upper edge portion of a right portion of the space of the first ventilation passage 270 including the bottom portion 272 communicate with each other in the width direction so that the space of the first portion 282 and the space of the first ventilation passage 270 slightly overlap in the up-down direction.

Similarly, a right side of a portion of the second portion 283 extending along the width direction and an upper edge portion of a left portion of the space of the first ventilation passage 270 communicate with each other in the width direction so that the space of the second portion 283 and the space of the first ventilation passage 270 slightly overlap in the up-down direction.

In this way, in the ventilation passage V, the space of the first ventilation passage 270 and each space of the first portion 282 and the second portion 283 slightly overlap with each other, so as to form the communication portions in which the bottom portion 272 of the first ventilation passage 270 and the bifurcated portions 284 of the second ventilation passage 280 communicate with each other in the width direction.

Each of the communication portions has a length in the front-rear direction and a length in the up-down direction. The communication portion is a hole having a substantially rectangular shape elongated in the front-rear direction. That is, the communication portion is configured to have the length in the front-rear direction to be longer than the length in the up-down direction. The communication portion is preferably designed so that a length of a shorter side thereof (in the present embodiment, the length in the up-down direction) is 0.25 mm or less. For example, when the length in the front-rear direction and the length in the up-down direction are equal (that is, the communication portion is a hole having a substantially square shape), it is preferable that the length in the front-rear direction and the length in the up-down direction are both designed to be 0.25 mm or less.

In other words, the communication portion on the right side is a gap in the up-down direction between an upper corner portion 273a of a side wall 273 defining the first ventilation passage 270 and a portion 272a of the bottom portion 272 located on a virtual extension line extending from the upper corner portion 273a along the up-down direction. The communication portion on the left side is a gap in the up-down direction between an upper corner portion 274a of a side wall 274 defining the first ventilation passage 270 and a portion 272b of the bottom portion 272 located on a virtual extension line extending from the upper corner portion 274a along the up-down direction.

Similar to the first embodiment, each of the communication portions between the first ventilation passage 270 and the second ventilation passage 280 is configured to be the narrowest in the ventilation passage V. Specifically, the communication portion is configured to have the smallest passage area among the passage areas in the ventilation passage V, and is also configured in a shape so that insects (particularly ants) that intrude the second ventilation passage 280 cannot intrude the first ventilation passage 270 (that is, the internal space S). The ventilation passage V of the third embodiment is smaller in the up-down direction than the ventilation passage V of the first embodiment, and is larger in the width direction than the ventilation passage V of the first embodiment and the ventilation passage V of the second embodiment. In this way, the shape of the ventilation passage V of the third embodiment is different from the shape of the ventilation passage V of the first embodiment.

The above is the description of the third embodiment. As described above, the description of the points configured in the same manner as in the first embodiment is omitted.

Functions and Effects

According to the resin molded article 1 according to the present embodiment, the first ventilation passage 70 and the second ventilation passage 80 communicate with each other by allowing the bottom portion 72 of the first ventilation passage 70 to communicate with the bifurcated portions 84 provided at an end portion of the second ventilation passage 80, and therefore, a temperature difference and a pressure difference between the internal space S and the outside are reduced.

In addition, the resin molded article 1 is configured such that the portions where the first ventilation passage 70 and the second ventilation passage 80 communicate with each other are the narrowest in the ventilation passage V. That is, by narrowing the communication portions between the first ventilation passage 70 and the second ventilation passage 80 while ensuring the ventilation amount in the ventilation passage V, the resin molded article 1 prevents insects from intruding the internal space S of the resin molded article 1 through the ventilation passage V.

Further, according to the resin molded article 1 according to the present embodiment, since each of the bifurcated portions 84 of the second ventilation passage 80 is configured to be narrower than the first ventilation passage 70, the ventilation passage V can be miniaturized as compared with a case where the above configuration is not adopted.

Further, according to the resin molded article 1 according to the present embodiment, since the filter 60 that does not allow liquid to pass through and allows gas to pass through is provided so as to cover the opening 71 of the first ventilation passage 70, liquid can be prevented from infiltrating into the internal space S through the ventilation passage V. As a result, the resin molded article 1 is superior in waterproofness as compared with a case where the filter 60 is not provided.

Further, according to the manufacturing method of the resin molded article according to the present embodiment, the resin molded article 1 that exhibits the above-mentioned effects can be manufactured only by using the first mold 91, the second mold 92, and the third mold 93.

Therefore, the resin molded article 1 according to the present embodiment can prevent the intrusion of insects without increasing the number of parts. Similarly, the hydraulic control device 7 according to the present embodiment can prevent the intrusion of insects without increasing the number of parts.

Although the description is given referring to the reference numerals of the first embodiment, the same effect can be obtained in the second embodiment and the third embodiment.

Other Embodiments

The present disclosure is not limited to the embodiments described above, and modifications, improvements, and the like can be made as appropriate. In addition, materials, shapes, dimensions, numbers, arrangement positions, and the like of components in the embodiments described above are optional and are not limited as long as the present disclosure can be achieved.

For example, the protrusions (91*a*, 191*a*, 291*a*) are not limited to a substantially rectangular parallelepiped shape, and may have a cylindrical shape.

Here, features of the embodiments of the resin molded article, the manufacturing method of the resin molded article, and the hydraulic control device according to the present disclosure described above will be briefly summarized and listed in the following [1] to [5].

[1] A resin molded article (1) having an internal space (S), the resin molded article (1) including:
- a ventilation passage (V) defined to allows the internal space to communicate with an outside of the resin molded article,
- wherein the ventilation passage (V) includes:
  - a first ventilation passage (70, 170, 270) extending from the internal space in a predetermined direction so as to include a bottom portion (72, 172, 272); and
  - a second ventilation passage (80, 180, 280) extending from the outside in a direction intersecting the predetermined direction,
- wherein the first ventilation passage (70, 170, 270) and the second ventilation passage (80, 180, 280) communicate with each other by allowing the bottom portion (72, 172, 272) to communicate with bifurcated portions (84, 184, 284) provided at an end portion of the second ventilation passage, and
- wherein a portion where the first ventilation passage (70, 170, 270) and the second ventilation passage (80, 180, 280) communicate with each other is the narrowest in the ventilation passage (V).

[2] The resin molded article (1) according to the above [1],
- wherein each (first portion 82, 182, 282, second portion 83, 183, 283) of the bifurcated portions (84, 184, 284) is narrower than the first ventilation passage (70, 170, 270).

[3] The resin molded article (1) according to the above [1] or the above [2], further including:
- a filter (60) configured not to allow liquid to pass therethrough and configured to allow gas to pass therethrough,
- wherein the filter (60) is provided so as to cover an opening (71, 171, 271) of the first ventilation passage (70, 170, 270) on an internal space (S) side.

[4] A manufacturing method of the resin molded article according to any one of the above [1] to the above [3], the manufacturing method using a first mold (91, 191, 291), a second mold (92) separated from and adjacent to the first mold, and a third mold (93, 193, 293), at least a part of the third mold being located between the first mold and the second mold,
- wherein the first mold (91, 191, 291) includes a protrusion (91*a*, 191*a*, 291*a*) that protrudes toward the second mold, and
- wherein the third mold (93, 193, 293) includes bifurcated portions (93*a*, 193*a*, 293*a*) at an end portion of the at least part located between the first mold (91, 191, 291) and the second mold (92),
- the manufacturing method including:
  - bringing the protrusion (91*a*, 191*a*, 291*a*) into contact with both of the bifurcated portions (93*a*, 193*a*, 293*a*) to hold the third mold (93, 193, 293) between the first mold (91, 191, 291) and the second mold (92);
  - injecting resin (resin material 94) into a space defined by the first mold (91, 191, 291), the second mold (92), and the third mold (93, 193, 293);
  - pulling out the third mold (93, 193, 293) from between the first mold (91, 191, 291) and the second mold (92) to define the second ventilation passage (80, 180, 280); and
  - removing the first mold (91, 191, 291) from the second mold (92) to define the first ventilation passage (70, 170, 270).

[5] A hydraulic control device (7), including:
- a metal housing (actuator unit 2) having an oil passage formed therein; and
- a resin molded article (1) disposed on one surface of the metal housing, in which
- wherein the resin molded article (1) accommodates a substrate (4) in a substrate accommodating portion (20) provided inside the resin molded article (1), the substrate (4) being configured to control a hydraulic pressure in the oil passage,
- wherein in the resin molded article (1), an electric control component (hydraulic valve 5) configured to control the hydraulic pressure in the oil passage is disposed in an apparatus accommodating portion (30) formed between the metal housing (actuator unit 2) and the substrate accommodating portion (20),
- wherein in the resin molded article (1), a ventilation passage (V) is defined to allow the substrate accommodating portion (20) to communicate with an outside of the resin molded article (1),
- wherein the resin molded article (1) includes a filter (60) configured not to allow liquid to pass therethrough and configured to allow gas to pass therethrough,
- wherein the ventilation passage (V) includes:

first ventilation passage (70, 170, 270) extending from the substrate accommodating portion in a predetermined direction so as to include a bottom portion (72, 172, 272); and a second ventilation passage (80, 180, 280) extending from the outside in a direction intersecting the predetermined direction, wherein the first ventilation passage (70, 170, 270) and the second ventilation passage (80, 180, 280) communicate with each other by allowing the bottom portion (72, 172, 272) to communicate with bifurcated portions (84, 184, 284) provided at an end portion of the second ventilation passage (80, 180, 280), wherein a portion where the first ventilation passage (70, 170, 270) and the second ventilation passage (80, 180, 280) communicate with each other is narrowest in the ventilation passage (V), wherein each of the bifurcated portions (84, 184, 284) is narrower than the first ventilation passage (70, 170, 270), and wherein the filter is provided so as to cover an opening of the first ventilation passage (70, 170, 270) on a substrate accommodating portion (20) side.

The resin molded article having the configuration in the above [1] will be described below. In the resin molded article, the ventilation passage including the first ventilation passage extending from the internal space of the resin molded article in the predetermined direction so as to include the bottom portion, and the second ventilation passage extending from the outside of the resin molded article in the direction intersecting the predetermined direction, is defined. In addition, the first ventilation passage and the second ventilation passage communicate with each other by allowing the bottom portion of the first ventilation passage to communicate with the bifurcated portions provided at the end portion of the second ventilation passage. That is, in the resin molded article, a ventilation passage that allows the internal space to communicate with the outside is defined. For example, when the internal space is sealed, pressure is applied to the internal space of the resin molded article, but since the ventilation passage is defined in the resin molded article having the configuration, a temperature difference and a pressure difference between the internal space and the outside are reduced. In addition, the resin molded article having the configuration is configured such that the portions where the first ventilation passage and the second ventilation passage communicate with each other are the narrowest in the ventilation passage. That is, by narrowing the communication portions between the first ventilation passage and the second ventilation passage while ensuring a ventilation amount in the ventilation passage, the resin molded article having the configuration prevents insects from intruding the internal space of the resin molded article through the ventilation passage. Therefore, the resin molded article having the configuration can prevent the intrusion of insects without increasing the number of parts.

According to the resin molded article having the configuration in the above [2], since each of the bifurcated portions of the second ventilation passage is configured to be narrower than the first ventilation passage, the ventilation passage can be miniaturized as compared with a case where the above configuration is not adopted.

According to the resin molded article having the configuration in the above [3], since the filter that does not allow liquid to pass therethrough and allows gas to pass through is provided so as to cover the opening on the internal space side of the first ventilation passage, liquid can be prevented from infiltrating into the internal space through the ventilation passage. As a result, the resin molded article having the configuration is superior in waterproofness as compared with a case where the filter is not provided.

According to the manufacturing method of the resin molded article having the configuration in the above [4], the resin molded article that exhibits at least the effects in the above [1] can be manufactured only by using the first mold, the second mold, and the third mold. Therefore, the manufacturing method of the resin molded article having the configuration can easily manufacture the resin molded article that can prevent the intrusion of insects without increasing the number of parts.

According to the hydraulic control device having the configuration in the above [5], similar to the resin molded article having the configuration in the above [1], by narrowing the communication portions between the first ventilation passage and the second ventilation passage while ensuring the ventilation amount in the ventilation passage, insects are prevented from intruding the internal space of the resin molded article through the ventilation passage. Therefore, the hydraulic control device having the configuration can prevent the intrusion of insects without increasing the number of parts.

In this way, according to the present disclosure, it is possible to provide a resin molded article, a manufacturing method of the resin molded article, and a hydraulic control device that can prevent intrusion of insects without increasing the number of parts.

What is claimed is:

1. A resin molded article having an internal space, the resin molded article comprising:
   a ventilation passage defined to allow the internal space to communicate with an outside of the resin molded article,
   wherein the ventilation passage includes:
      a first ventilation passage extending from the internal space in a predetermined direction so as to include a bottom portion; and
      a second ventilation passage extending from the outside in a direction intersecting the predetermined direction,
   wherein the first ventilation passage and the second ventilation passage communicate with each other by allowing the bottom portion to communicate with bifurcated portions provided at an end portion of the second ventilation passage, and
   wherein a portion where the first ventilation passage and the second ventilation passage communicate with each other is narrowest in the ventilation passage.

2. The resin molded article according to claim 1,
   wherein each of the bifurcated portions is narrower than the first ventilation passage.

3. The resin molded article according to claim 1, further comprising:
   a filter configured not to allow liquid to pass therethrough and configured to allow gas to pass therethrough,
   wherein the filter is provided so as to cover an opening of the first ventilation passage on an internal space side.

4. A manufacturing method of the resin molded article according to claim 1, the manufacturing method using a first mold, a second mold separated from and adjacent to the first mold, and a third mold, at least a part of the third mold being located between the first mold and the second mold,
   wherein the first mold comprises a protrusion that protrudes toward the second mold, and wherein the third mold comprises bifurcated portions at an end portion of the at least part located between the first mold and the second mold, the manufacturing method comprising:

bringing the protrusion into contact with both of the bifurcated portions to hold the third mold between the first mold and the second mold;

injecting resin into a space defined by the first mold, the second mold, and the third mold;

pulling out the third mold from between the first mold and the second mold to define the second ventilation passage; and removing the first mold from the second mold to define the first ventilation passage.

5. A hydraulic control device comprising:

a metal housing having an oil passage formed therein; and a resin molded article disposed on one surface of the metal housing, wherein the resin molded article accommodates a substrate in a substrate accommodating portion provided inside the resin molded article, the substrate being configured to control a hydraulic pressure in the oil passage, wherein in the resin molded article, an electric control component configured to control the hydraulic pressure in the oil passage is disposed in an apparatus accommodating portion formed between the metal housing and the substrate accommodating portion, wherein in the resin molded article, a ventilation passage is defined to allow the substrate accommodating portion to communicate with an outside of the resin molded article, wherein the resin molded article comprises a filter configured not to allow liquid to pass therethrough and configured to allow gas to pass therethrough, wherein the ventilation passage includes:

a first ventilation passage extending from the substrate accommodating portion in a predetermined direction so as to include a bottom portion; and a second ventilation passage extending from the outside in a direction intersecting the predetermined direction, wherein the first ventilation passage and the second ventilation passage communicate with each other by allowing the bottom portion to communicate with bifurcated portions provided at an end portion of the second ventilation passage, wherein a portion where the first ventilation passage and the second ventilation passage communicate with each other is narrowest in the ventilation passage, wherein each of the bifurcated portions is narrower than the first ventilation passage, and wherein the filter is provided so as to cover an opening of the first ventilation passage on a substrate accommodating portion side.

6. The resin molded article according to claim 1, wherein the bottom portion comprises a protrusion that defines the bifurcated portions on either side thereof.

* * * * *